United States Patent [19]

Nys et al.

[11] Patent Number: 4,635,133
[45] Date of Patent: Jan. 6, 1987

[54] PHOTOGRAPHIC METHOD FOR THE PRODUCTION OF DOCUMENTS

[75] Inventors: Pierre H. Nys, Berchem; Leon L. Vermeulen, Herenthout, both of Belgium

[73] Assignee: AGFA-Gevaert N.V., Mortsel, Belgium

[21] Appl. No.: 684,104

[22] Filed: Dec. 20, 1984

[30] Foreign Application Priority Data

Dec. 29, 1983 [EP] European Pat. Off. ........ 83201868.3

[51] Int. Cl.[4] .................. H04N 1/21; H04N 1/23; G03B 27/02
[52] U.S. Cl. .................... 358/298; 358/302; 355/79
[58] Field of Search ............ 358/296, 298, 302; 355/78, 79, 85, 132

[56] References Cited

U.S. PATENT DOCUMENTS

| | | | |
|---|---|---|---|
| 3,949,159 | 4/1976 | Ricards et al. | 358/302 X |
| 4,002,829 | 1/1977 | Hutchison | 358/302 X |
| 4,135,212 | 1/1979 | Pugsley et al. | 358/296 X |
| 4,496,989 | 1/1985 | Hirosawa | 358/296 |

*Primary Examiner*—Harold Broome
*Assistant Examiner*—Patrick Foster
*Attorney, Agent, or Firm*—William J. Daniel

[57] ABSTRACT

Method for the photographic production of a document by simultaneously photographically copying a continuous tone image and a graphic data pattern with a single common exposure source, characterized in that continuous tone image is exposed to said light source and the thereby image-wise modulated light image is projected through a screen dividing the light-image in dots of varying size onto one area of a photographic material, and the graphic data is simultaneously exposed to said light source and the thereby pattern-wise modulated light is projected through a screen dividing the original halftone pattern in dots of substantially same size printing them within a dot percentage range of 50 to 99%.

11 Claims, 1 Drawing Figure

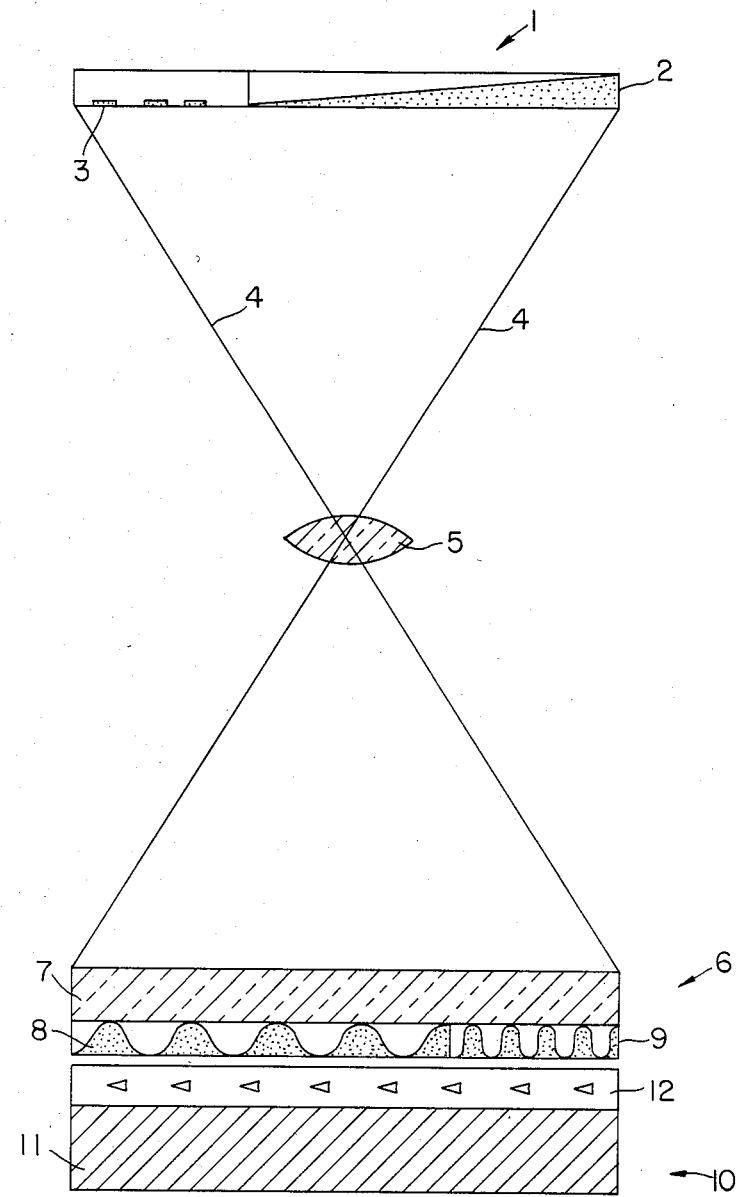

PHOTOGRAPHIC METHOD FOR THE PRODUCTION OF DOCUMENTS

The present invention relates to a photographic method for the production of documents particularly for use for identification purposes.

Well known identification documents contain a black-and-white or colour photograph sandwiched between a clear plastic protective cover sheet and a rear support sheet. The assembly is laminated together to provide a durable identification document known as an ID card.

The widespread use of ID cards as security document to establish a person's identity, and to establish authorization to conduct certain activities (e.g. driver's license) or to allow admission to restricted areas or to engage in commercial activity, means that it is important that forgery of the ID card by alteration of its data and/or photograph is made impossible.

A photographically produced identification document usually includes in addition to a portrait one or more items of information in graphic form relating to the person to whom it is issued or information particular to a predetermined security system, for example a signature, finger prints, words, figures, code marks, water marks or grid structures.

According to a particular technique the pictorial and graphic data information are photographically recorded on one image carrier, as described for example in the U.S. Pat. No. 4,011,570, wherein a photographic camera is described for exposing a single photographic light-sensitive material to different subjects to form images thereof at different locations on such material, which camera comprises a storage station containing a roll of photographic material, at least two exposure stations arranged in succession, one of such stations incorporating masking means adapted to shield at least two areas of the material while the remainder thereof is being exposed to light at that station, the other station having optical projecting means for projecting an image of one subject onto one of the initially shielded areas and an image of at least one other subject onto another such areas of the photographic material, transport means for delivering predetermined lengths of photographic material from the roll to the exposure stations, severing means actuatable to sever predetermined lengths of photographic material and web engaging means upstream of said severing means intermittently operable to immobilize the photographic material during the actuation of said severing means.

This kind of camera may be used advantageously for making simultaneously photographs of at least two images on a given silver halide photographic material suited for use in a silver complex diffusion transfer reversal (DTR-) process. The DTR-process makes use of a light-sensitive silver halide emulsion material, normally having a negative working silver halide emulsion layer operating together with an image receptor material provided with so-called development nuclei in the form of colloidal particles of heavy metal or metal sulphides acting as a catalyst for the development to metallic silver of silver complex salts transferred by diffusion. With said camera a person outside the camera is photographed simultaneously with data relating to said person, which data are introduced on a card by means of a typewriter or computer printer and are exposed with a light-source inside the camera body.

In some occasions, however, where the portrait is available already and the protrait has to be copied together with the personal graphic data it would be desirable to use a single light source yielding a same exposure dose for the portrait to be copied and the graphic data to be reproduced. A difficulty arises however, in that it is practically impossible to obtain simultaneously a correct continuous tone reproduction of the portrait and a sufficiently optically dense reproduction of the graphic data (halftone or linework data, e.g. text of a typewriter). Thus in a simultaneous exposure either the copied portrait maintains the full range of brightness (also called lightness) of the original and the graphic data (text) are reproduced with a too weak density, or the copied portrait shows loss of brightness range and the text comes through with high optical density.

It is an object of the present invention to use a single light source under conditions leading to the reproduction of continuous tone information and line work both of high quality suitable for use in identification documents, namely by the use of different screens for reproducing the continuous tone original and the original containing graphic data.

Other objects and advantages of the present invention will become clear from the further description.

According to the present invention there is provided a method for the photographic production of a document by simultaneously photographically copying a continuous tone original and a graphic data pattern original in a common exposure stage and developing the images thus produced, characterized in that the continuous tone original is exposed to a light source and the thereby image-wise modulated light image is projected through a screen dividing the light-image in dots of varying size onto a photographic material, and the graphic data pattern original is simultaneously exposed to the same light source and the thereby pattern-wise modulated light image is projected through a screen dividing the image of the original halftone pattern in dots of substantially the same size within a dot percentage range of 50 to 99%.

Preferably the continuous tone original and the graphic data pattern original are both positives.

The photographic material used in the method of the present invention is preferably a photographic silver halide emulsion material. In a very convenient and rapid image reproduction technique the photographic silver halide emulsion material is of the negative working type used in the silver complex diffusion transfer reversal process in combination with an image receptor material to form thereon a screened copy of the continuous tone image and the graphic data pattern. According to an other embodiment the silver halide photographic material is of the direct-positive type known to those skilled in the art.

By "dot-percentage" is meant the percentage ratio of the area covered by the dots to the area left open between the dots.

The screens used in the reproduction of the continuous tone image and likewise the screens used in the graphic data reproduction have for increasing the security aspect preferably a screen ruling of 80 to 200 lines per cm. Such screen ruling is impossible to perceive with the naked eye and is very difficult to reproduce by printing.

By "screen ruling" is meant the distance or interval between neighbouring lines or dots of the screen, which screen ruling corresponds with 125 microns to 50 microns for a screen of 80 to 200 lines per cm.

The screen used in the reproduction of the continuous tone image (portrait) may be any contact or gravure screen suited for continuous tone reproduction in which the continuous tone variations are simulated by means of screen dots varying in size. In practice a contact screen is preferred.

A survey of contact and gravure screens for commercial purposes is given in the booklet: "Screens and their Application" by Raster-Union EFHA-KOHINOOR GmbH & Co. KG. (1983) Hans-Urmiller Strasse-D-8190 Wolfratshausen 1, W. Germany. Grey negative contact screens are used preferably to produce halftone negatives from continuous tone originals.

The optical density distribution in a cross-section of a dot of a conventional contact screen, positive contact screen and negative contact screen is illustrated in the handbook of Modern Halftone Photography of E. Fred Noemer-published by Perfect Graphic Arts Demarest, N.J.-U.S.A. (1965) pages 86 and 92. These screens have their dots arranged in a chess board pattern.

When in the production of identification documents the silver complex diffusion transfer reversal (DTR-) process is used the screen range of the screen used in the reproduction of the continuous tone image is preferably such that by the light dose used in the exposure of the area of the photographic silver halide emulsion material intended for the continuous tone (portrait) reproduction a correct reproduction (i.e. tone reproduction) of the continuous tones of the original image is obtained on the image receptor material. The screen range, being also defined as density range, is the difference between maximum density ($D_{max}$) and minimum density ($D_{min}$) of the screen.

A contact screen used in the method of the present invention for producing a "dotted" reproduction of the graphic data (line originals) has preferably dots with very sharp transition from the minimum density of the screen dot to its maximum density. By "very sharp transition" is understood that the distance from minimum to maximum density in the screen dots is from 0 to 20 microns for dots having a width in the range of 63 to 5 microns. Such type of screen is called a screen tint type screen (a square wave type screen) or screen with high gradation dots.

When carrying out the silver complex diffusion transfer reversal process in the method of the present invention the maximum density ($D_{max}$) of the screen used in the reproduction of the graphic data is preferably such that the light-exposure dose used for obtaining a correct continuous tone reproduction of the continuous tone image on the image receptor material is strong enough to effect light-penetration in the maximum density parts of the dots of said screen up to a level just below that which could produce developable silver halide in the photographic material.

In a preferred embodiment the contact screen used in the reproduction of the graphic data pattern has for further increasing the security of the document a characteristic geometric structure whereby the dots in the copy of the pattern obtain a particular shape, that can be recognized only under magnification of at least 5.

The preparation of contact screens with screen dots having the above defined sharp transition from $D_{min}$ to $D_{max}$ proceeds e.g. by making in a camera (with lens system) a copy of a line gravure screen on a photographic lith- or line-material. By properly controlling the light dose a required line width is obtained in the copy and subsequently two of these copies are placed in overlay with their lines crossed and the overlay assembly is contact-exposed onto another lith- or line material that is developed with lith-gradation to form the contact screen.

By varying the angle between the two line screen copies a chess board pattern of dots of a particular dot shape varying from square to parallelogram is obtained in the print which serves as a contact screen for use according to the present invention. By using in overlay two line screens of different line width the dot shape may vary from square to rectangle.

A contact screen with a special dot shape can be prepared likewise in a camera by making a copy of a cross-like gravure screen on a photographic lith- or line-material using a diaphragm with a particular shape and size the shape of the diaphragm being projected onto the photographic material so that dots with a particular shape are obtained in the resultant print serving as a screen for use according to the present invention in the reproduction of the graphic data pattern (linework).

In the reproduction of the continuous tone image as a screened image the dots may likewise have a particular shape determined by the choice of the geometrical structure of the screen and they may be of a size for being only recognizable under a magnification of at least 5.

In "lith- or line-materials the silver halide comprises at least 50 mole % of chloride, the balance, if any, being bromide and optionally a minor amount of iodide. Lith-gradation stands for high contrast reproduction, i.e. with maximum gradient (gamma) above 10, (see the already mentioned handbook of Modern Halftone Photography of E. Fred Noemer pages 54–55). A developer suited for producing lith-gradation is described e.g. in the United Kingdom Patent Specification 1,376,600.

The present invention is illustrated by the following example, without however limiting it thereto.

EXAMPLE

A lay-out containing (1) on a separate opaque white paper base a continuous tone image, such as a black-and-white or colour portrait of the subject to be identified and (2) on another opaque white paper base a typewritten text providing information e.g. name, address, date of birth and nationality of the portrayed person was arranged on the copy board of a lens type camera, e.g. a REPROMASTER 2000 process camera. REPROMASTER is a trade name of Agfa-Gevaert N.V. Belgium. In the film plane of said camera a COPYPROOF NPC material was laid in contact with a grey negative contact screen adequately covering (with some excess) the area of the photographic material whereon the portrait has to be reproduced. In the area whereon the text part of the lay-out has to be reproduced a screen tint type screen was laid. The latter screen contained screen dots with a width of 13 micron having a transition of $D_{max}$ to $D_{min}$ in the dots over a distance of 4.5 micron. The maximum density of the screen dots of the screen tint type screen was 0.78. Dots having a rectangular structure with a dot percentage of 80% are produced with said screen.

The screen ruling of said both screens was 80 lines per centimeter.

COPYPROOF NPC is a trade name of Agfa-Gevaert N.V. Belgium for a negative working silver halide emulsion material which contains developing agents and which is used in the silver complex diffusion transfer reversal process.

After exposure the COPYPROOF NPC material was developed in an aqueous alkaline activator liquid in the COPYPROOF CP 38 (trade name of Agfa-Gevaert N.V.) DTR-developing apparatus. After activation in this unit the COPYPROOF NPC material was put into contact with a sheet of a COPYPROOF CPP (trade name of Agfa-Gevaert N.V. Belgium for a DTR-image receptor material). After a diffusion time of 60 seconds a combined image on a single sheet was obtained in which the continuous tone information was formed by dots of different size and of which the graphic data information was composed by dots of nearly the same dot size, rectangular shape and with a dot percentage of 80%.

The obtained image was enclosed between thermoplastic resin sheets by lamination forming hereby an identification document protected against forgery.

The drawing represents a schematic section view of an exposure arrangement using a process camera as defined in the present Example 1.

On the transparent copy board (not shown in the drawing) of said camera an original 1 is placed. The original 1 contains continuous tone information represented here by the continuous tone wedge 2 and text represented by the markings 3.

Light rays 4 originating from the original 1 are projected through the lens system 5 of the process camera towards its film plane supporting a contact screen assembly 6 consisting of a transparent support 7 and a common graphic art sinus-wave screen 8 adjacent a square wave type screen 9 having a "very sharp transition" as defined herein. By the common graphic art screen the continuous tone image is reproduced as a screened image containing screen dots of varying size. By the square wave screen the line work is represented in the form of dots of substantially same size in a dot percentage range of 50 to 90%.

We claim:

1. Method for the photographic production of a composite reproduction of a continuous tone original and a graphic data pattern original in a single simultaneous photographic exposure stage and developing the images thus produced, which comprises the steps of exposing the continuous tone original to a light source and projecting the thereby image-wise modulated light image through a screen dividing said light-image in dots of varying size onto one area of a photographic light-sensitive material, and simultaneously exposing the graphic data pattern original to the same light source and projecting onto another area of said light-sensitive material the thereby pattern-wise modulated light image through a screen dividing the original halftone pattern in dots of substantially same size within a dot percentage range of 50 to 99%.

2. Method according to claim 1, wherein said screens have a screen ruling of 80 to 200 lines per cm.

3. Method according to claim 1, wherein said screens are contact screens.

4. Method according to claim 1, wherein the screen used in the reproduction of a positive continuous tone original is a grey negative contact screen.

5. Method according to claim 1, wherein the screen used for the reproduction of the graphic data pattern original is a contact screen having a distance of transition between minimum and maximum density from 0 to 20 microns for a dot width in the range of 63 to 5 microns.

6. Method according to claim 3, wherein the contact screen used for the graphic data pattern original has a geometrical structure whereby in the reproduction screen dots of a particular shape are produced that can be recognized only under a magnification of at least 5.

7. Method according to claim 3, wherein the contact screen used for the continuous tone original has a geometrical structure whereby in the reproduction, screen dots of a particular shape are produced that can be recognized only under a magnification of at least 5.

8. Method according to claim 5, wherein the contact screen is prepared by making in a camera a copy of a line gravure screen on a photographic lith- or line-material so as to produce by properly controlling the light dose a required line width in the copy, and subsequently two of said copies are placed in overlay with their lines crossed, and the overlay assembly is contact-exposed onto another lith- or line material that is developed with lith-gradation to form the said contact screen.

9. Method according to claim 5, wherein the contact screen is prepared by making a copy of a cross-line gravure screen on a photographic lith- or line-material using a diaphragm of a particular shape and size, the shape of the diaphragm being projected onto the photographic material so that screen dots with a particular shape are obtained in the resultant print.

10. Method according to claim 1, wherein the light-sensitive material is a photographic silver halide emulsion material adapted for use in the silver complex diffusion transfer reversal process in combination with an image receptor material to form thereon a screened copy of the continuous tone image and graphic data pattern.

11. Method according to claim 10, wherein the modulated light image of the graphic data pattern is projected through a contact screen in which the maximum density of the dots is such that the light-exposure dose used for obtaining a correct continuous tone reproduction on the image receptor material is strong enough to effect light-penetration in the maximum density parts of the said dots up to a level just below that which could produce developable silver halide in the photographic material.

* * * * *